United States Patent
Vaucher

(10) Patent No.: US 7,027,544 B2
(45) Date of Patent: Apr. 11, 2006

(54) DATA CLOCKED RECOVERY CIRCUIT

(75) Inventor: Cicero Silveira Vaucher, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 759 days.

(21) Appl. No.: 09/799,828

(22) Filed: Mar. 5, 2001

(65) Prior Publication Data
US 2001/0031028 A1   Oct. 18, 2001

(30) Foreign Application Priority Data
Mar. 7, 2000   (EP) .................................. 00200804

(51) Int. Cl.
*H04L 7/00* (2006.01)
(52) U.S. Cl. .......................... 375/355; 327/91; 327/291
(58) Field of Classification Search ................ 375/354, 375/355, 371, 362; 331/25, 34, 57, 60, 175, 331/177; 327/91, 291
See application file for complete search history.

(56) References Cited

U.S. PATENT DOCUMENTS

| | | | | |
|---|---|---|---|---|
| 5,150,364 A | * | 9/1992 | Negus ......................... | 370/542 |
| 5,301,196 A | | 4/1994 | Ewen et al. ............. | 370/105.2 |
| 5,485,484 A | * | 1/1996 | Williams et al. ............. | 375/376 |
| 5,712,580 A | * | 1/1998 | Baumgartner et al. ........ | 327/12 |
| 6,041,090 A | * | 3/2000 | Chen .......................... | 375/376 |
| 6,072,337 A | * | 6/2000 | Dalmia et al. ................ | 327/12 |
| 6,075,416 A | | 6/2000 | Dalmia ......................... | 331/25 |
| 6,100,722 A | * | 8/2000 | Dalmia ......................... | 327/12 |
| 6,225,831 B1 | * | 5/2001 | Dalmia et al. ................ | 327/12 |
| 6,316,966 B1 | * | 11/2001 | Chang et al. .................. | 327/2 |
| 6,347,128 B1 | * | 2/2002 | Ransijn ....................... | 375/376 |

FOREIGN PATENT DOCUMENTS

DE           19717586 C    8/1998

OTHER PUBLICATIONS

"Clock/Data Recovery PLL Using Half-Frequency Clock", by M. Rau et al, IEEE Journal of Solid State Circuits, Vo. 32, No. 7, Jul. 1997, XP 000729379.
"1 Gb/s Clock Recovery PLL in O.5 µm CMOS", by M. Rau et al., XP 001010891.

* cited by examiner

*Primary Examiner*—Jean B. Corrielus
(74) *Attorney, Agent, or Firm*—Larry Liberchuk

(57) ABSTRACT

A data clock recovery circuit comprises a controllable quadrature clock oscillator operating at half the data rate of data input to said circuit, and a phase detector logic having detector inputs coupled to the data input and having a detector output coupled to a frequency control input of the quadrature clock oscillator. The data clock recovery circuit further comprises a parallel arrangement of sampling devices, in particular flip-flops each having a clock input which is coupled to the controllable quadrature clock oscillator, a data input for the data input to said circuit, and a data output coupled to the phase detector. Accurate control of the phase of recovered data is possible with the present circuit, which is easy to integrate on a limited chip area and in a low power consuming way.

8 Claims, 4 Drawing Sheets

| Va | Vb | Vt | Up ( late ) | Dn ( early ) |
|---|---|---|---|---|
| 0 | 0 | X | 0 | 0 |
| 1 | 1 | X | 0 | 0 |
| 0 | 1 | 0 | 1 | 0 |
| 0 | 1 | 1 | 0 | 1 |
| 1 | 0 | 0 | 0 | 1 |
| 1 | 0 | 1 | 1 | 0 |

DATA CLOCKED RECOVERY CIRCUIT

The present invention relates to a data clock recovery circuit comprising a controllable quadrature clock oscillator operating at half the data rate of data input circuit, and a phase detector logic having detector inputs coupled to the data input and having a detector output coupled to a frequency control input of the quadrature clock oscillator.

The present invention also relates to a data receiver provided with such a data clock recovery circuit and to a communication device, such as an optical communication device provided with such a data clock recovery circuit.

Such a clock recovery circuit is known from U.S. Pat. No. 5,301,196. The known clock recovery circuit is provided with a controllable quadrature clock oscillator, a phase detector logic in the form of a phase comparator having comparator data inputs coupled to I and Q outputs of the quadrature oscillator and having comparator clock inputs coupled to a data input of the clock recovery circuit. The known clock recovery circuit is provided with a loop filter interconnecting a data output of the phase comparator and a control input of the controllable quadrature clock oscillator. The clock recovery circuit generates quadrature oscillator signals at half the rate of data input stream received on a data input of the recovery circuit. The quadrature oscillator signals are sampled by the input data in sampling devices, embodied as edge triggered flip-flops and then XORed to provide a loop filter signal. In addition the recovery circuit comprises a demultiplexer circuit. This demultiplexer circuit comprises a parallel arrangement of sampling devices in the form of flip-flops, each having a clock input which is coupled to the controllable quadrature clock oscillator, a data input for the data input to said recovery circuit, and a demultiplexer output for providing demultiplexed data. The demultiplexer circuit uses the rising and falling edges of the half speed quadrature clock to latch the input data stream through the pair of flip-flops.

It is a disadvantage of the known clock recovery circuit that cumulative delays arise, which are caused by the flip-flops, the XOR, the loop filter and the ring oscillator respectively. These delays in addition to delays caused by necessary run time delay data of the oscillator loop lead to a low accuracy and to decision errors in the recovered data.

It is an object of the present invention to provide an improved data clock recovery circuit, which may be fully integrated on a limited chip area and which shows an improved accuracy and robustness.

Thereto the data clock recovery circuit according to the invention is characterized in that the data clock recovery circuit further comprises a parallel arrangement of sampling devices each having a clock input which is coupled to the controllable quadrature clock oscillator, a data input for the data input to said circuit, and a data output coupled to the phase detector logic.

It is an advantage of the data clock recovery circuit according to the present invention that in the recovery circuit the quadrature oscillator signal is used a as clock signal for clocking the data input stream. Because the data input stream is thus clocked as recovered data to the phase detector logic this logic is capable of providing tight control over the thus improved phase accuracy of the recovered data. Furthermore the data clock recovery circuit according to the invention is self-correcting which means that the time delays at the place of the data output are controlled away, which means that decision errors in the recovered bits are reduced.

An easy to integrate embodiment of the data clock recovery circuit according to the invention is characterized in that the sampling devices form a parallel arrangement of flip-flops. These flip-flops are in a further embodiment provided with clock inputs which are responsive to either the raising, or falling edges of the respective I and Q oscillator signals of the quadrature clock oscillator. In this case the flip-flops are easy to manufacture D or edge flip-flops.

A further embodiment of the data clock recovery circuit according to the invention is characterized in that the data outputs of the respective sampling devices are coupled to controllable switches each having a switch control input coupled to the quadrature clock oscillator, two data inputs coupled to the respective outputs of the sampling devices, and switch outputs for providing serial output data.

Although in certain practical implementations of the present invention it may be useful to directly use the recovered/regenerated parallel data output stream from the parallel arrangement of sampling devices, it may in other implementations be more useful to multiplex the parallel data output stream to a serial output data stream. The latter data stream is now generated by a simple multiplexer in the form of controllable switch.

A still further embodiment of the data clock recovery circuit according to the invention is characterized in that one of the controllable switches is replaced by a latch device, the latch device having a clock input coupled to the quadrature clock oscillator, and a data input coupled to the respective output of the sampling device.

Advantageously the embodiment having a latch device provides a latch data output signal having transitions arising a the same time as transitions at the corresponding output of the respective sampling device.

Another embodiment of the data clock recovery circuit according to the invention is characterized in that said circuit comprises (bit error rate) BER detector logic, and the data outputs of the respective sampling devices are coupled to a further controllable switch having a switch control input coupled to the quadrature clock oscillator, two data inputs coupled to the respective outputs of the sampling devices, and a switch output coupled to the BER detector logic.

Advantageously the fully to integrate and thus low power consuming present embodiment is capable of providing bit error rate information, which may be used for error indication and/or correction purposes. The additional chip area necessary to implement this function is advantageously small.

Still another easy to implement embodiment of the data clock recovery circuit according to the invention is characterized in that the phase detector logic and the bit error rate detector logic comprise elementary digital logic circuits, such as exclusive OR gates, inverters and logic gates, like AND, NAND, OR, NOR gates.

At present the data clock recovery circuit, data receiver and communication device according to the invention will be elucidated further together with its additional advantages while reference is being made to the appended drawing, wherein similar components are being referred to by means of the same reference numerals. In the drawing.

Figure 1:
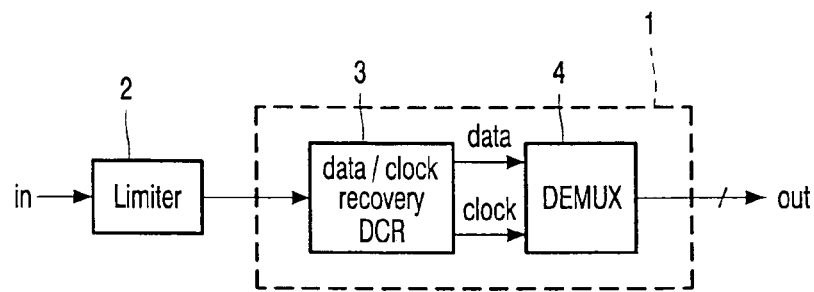
FIG. 1 shows a schematic representation of a data receiver for application in a communication device according to the invention.

FIG. 1 shows a schematic representation of a data receiver 1 for application in a communication device, such a long-distance optical glass fibre communication device (not shown) SDH/SONET, or computer network, such as gigabit Ethernet. As shown a limiter 2 precedes the data receiver 1. Data is input to the limiter. The data receiver 1 comprises a data clock recovery circuit 3 and may comprise a demultiplexer 4. The data and clock recovered from the circuit 3 are fed to the demultiplexer 4, which provides a parallel data output. In particular serial input data, such as non-return-to-zero data is received and converted to recovered and synchronized parallel output data.

Figure 2:
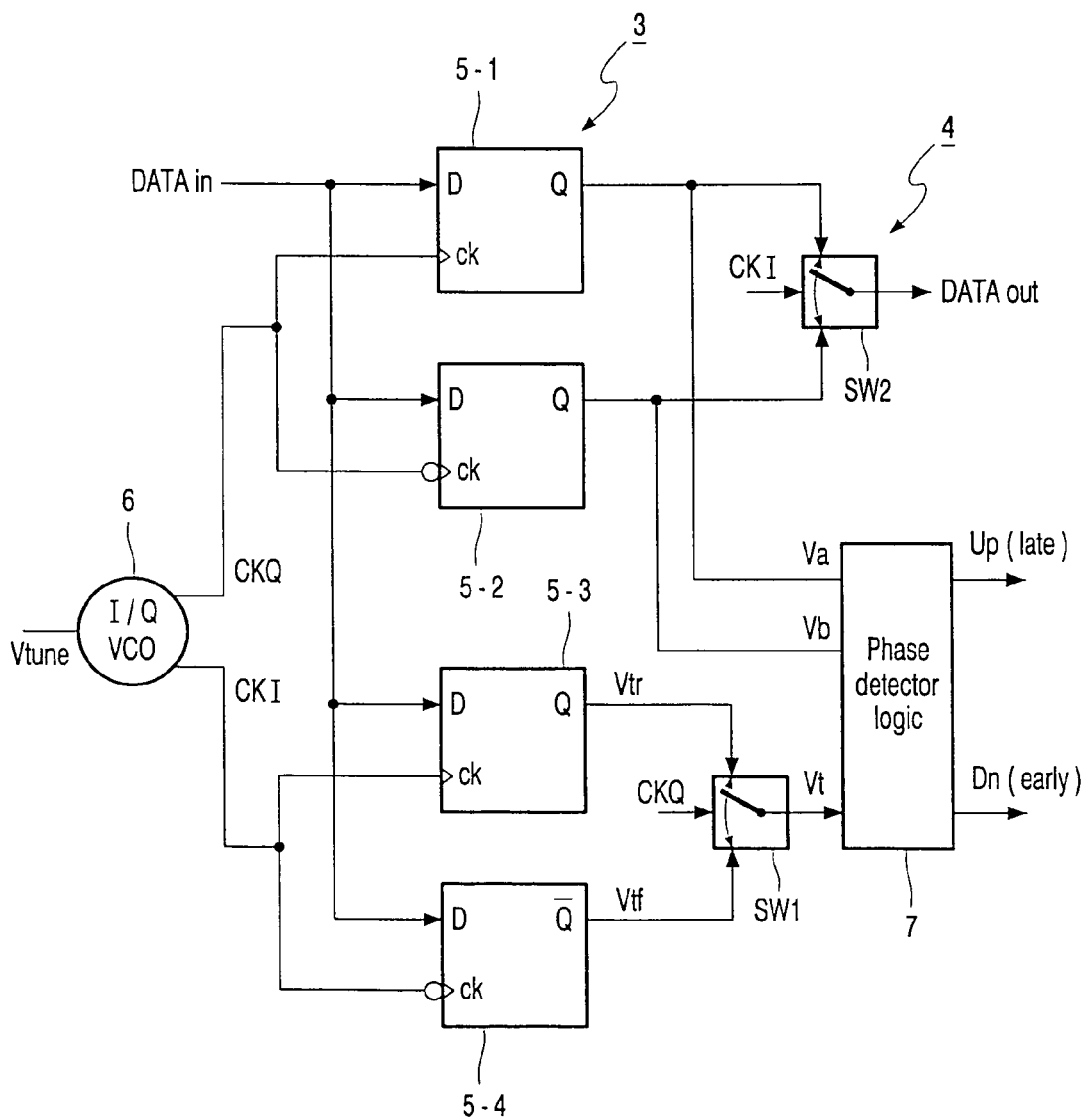
FIG. 2 shows an outline of several possible embodiments of the data clock recovery circuit for application in the data receiver according to FIG. 1.

FIG. 2 shows an outline of several possible embodiments of the data clock recovery circuit 3 with or without serialiser 4, which circuit 3 is for application in the data receiver 1 of to FIG. 1. Data input to the recovery circuit 3 at DATA in is fed to a parallel arrangement 5 of sampling devices 5-1, 5-2, 5-3 and 5-4 each having a clock input ck, a data input D coupled to DATA in, and a data output Q, Q invert. The sampling devices 5 may be flip-flops, such as D flip-flops. The recovery circuit 3 comprises a controllable quadrature clock oscillator 6 and a phase detector logic 7. The clock inputs ck of the sampling devices 5-1, 5-2 is coupled to the one quadrature output CKQ of the oscillator 6, while the other quadrature output CKI is coupled to clock inputs ck of the oscillator 6. Outputs Q of sampling devices 5-1, 5-2 provide parallel output data fed as Va and Vb to inputs of the phase detector logic 7. In a possible embodiment output signal Vtr of sampling device 5-3 can be coupled directly to input Vt of the detector logic 7. The logic 7 provides an UP/DN control signal for tuning the frequency of the quadrature oscillator signals CKQ and CKI by means of a frequency control input Vtune of the oscillator 6. In the embodiment as shown in FIG. 2 the recovery circuit 3 comprises a controllable switch SW1 having a switch control input coupled to the signal CKQ and a controllable switch SW2 having a switch control input coupled to the signal CKI. Each of the controllable switches SW1 and SW2 have two data inputs coupled to the respective outputs Vtr, Vtf and Q, Q of devices 5-1, 5-2 respectively, and switch outputs Vt and DATAout respectively for providing a further detector logic input signal and serialized output data respectively. The two switches SW1 and SW2 may be identical and there operation (related to SW1) is governed by the relations:

If CKQ=high then Vt=Vtr, if CKQ=low then Vt=Vtf.

If switch SW2, which functions as a multiplexer/serialiser is absent parallel output data is provided by the demultiplexing sampling devices 5-1, 5-2, else DATAout provides serial output data. By way of example the operation of the data clock recovery circuit 3 in the embodiment as fully shown in FIG. 2 will be explained.

Figure 3:
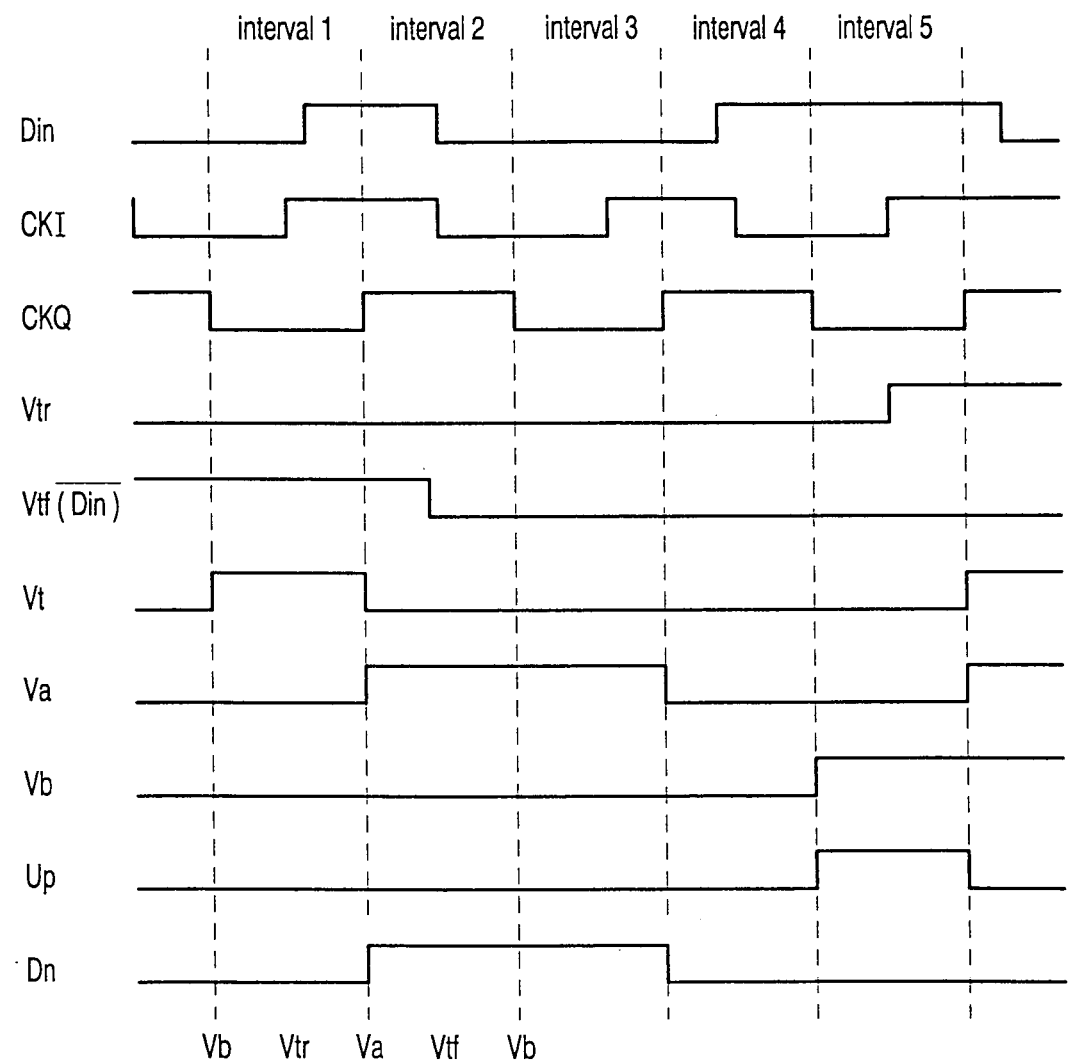
FIG. 3 shows an illustration of signals for elucidating the operation of the data clock recovery circuit of FIG. 2.

FIG. 3 shows an illustration of signals in consecutive intervals 1, 2, . . . 5 for elucidating the operation of the data clock recovery circuit of FIG. 2. Schematically it is illustrated in FIG. 2, that the data input stream Din is sampled by the sampling circuits 5-1 and 5-3 at the rising edge of CKQ and CKI respectively, while sampling circuits 5-2 and 5-4 are sampled at the falling edge of clock signals CKQ and CKI respectively. Both the quadrature clock signals are exact copies of a 10101010 Din sequence, and thus after synchronization of the quadrature oscillator control loop these clock signals have a frequency which is half the bit-rate used. After synchronization has been accomplished, transitions in the DATAout signal will occur (ideally) at the rising and/or falling edges of the CKI signal. Therefore the CKQ signal, which is delayed by 90 degrees relative to the CKI signal can be used to sample the DATAin signal in the middle of the well known eye-diagram, which is the ideal moment therefor. This takes place in sampling circuits 5-1 and 5-2. Given an arbitrary Din pattern, in intervals 1 and 2 respectively the Din transitions lag the CKI transitions. The phase detector logic processes this in the next intervals 2 and 3 respectively setting the Dn signal active, which lowers the oscillator 6 frequency. Contrary in interval 4 Din transition precedes CKI transition, which is processed in interval 5 setting UP active, advancing the quadrature clock signals CKI and CKQ in phase. It is to be noted that in order to provide correct functionality in this case, with only one switch SW1, the inverted output Q invert has to provide the signal Vtf. The basic idea of the algorithm is that the Vt signal, which is derived from the samples taken during the rising and falling edges of CKI, will equal Vb when CKI transitions are leading the DATA in transitions, and will equal Va when CKI transitions are lagging the DATA in transitions.

During interval 3 no transitions are present in the DATA in signal and thus the Va and Vb signals are equal in the next interval. In that case, either the UP Dn signals are reset, or one of these signals may stay in the active state, as set by the information derived from the latest data transition. The former is a robust option to be used with unencoded data signals, such as those employed in SDH/SONET networks, where very long sequences of 1's and 0's may occur. Correction signals are then only generated after transitions in the data are detected, and such correction signals do not last longer than one bit period. The latter option can only be applied in systems where the data is properly encoded so that a DC free content and minimum amount of transitions is guaranteed. The considerations of the foregoing lead to the truth FIG. 6.

Figures 4, 6:
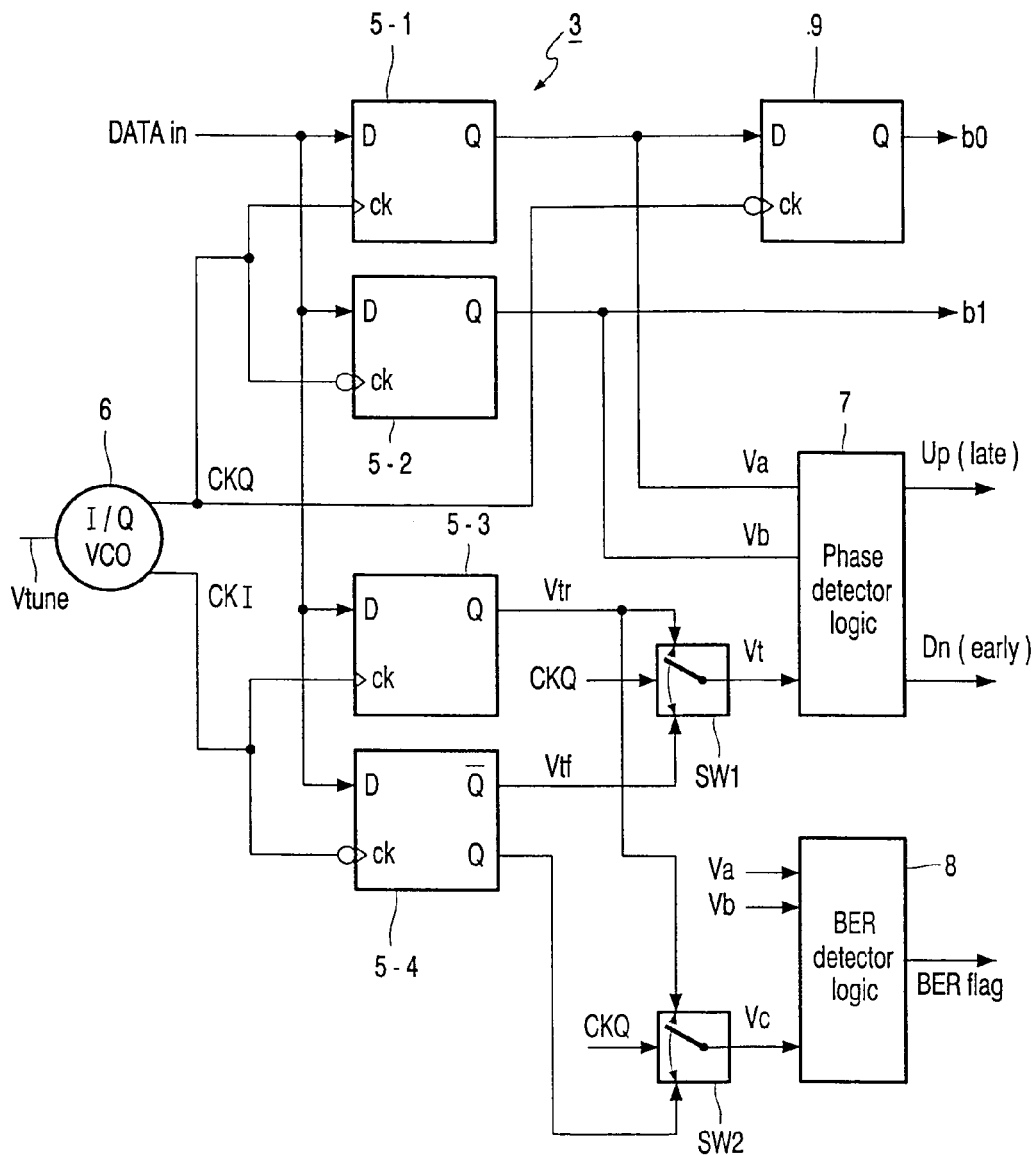
FIG. 6 shows a truth table for describing the operation of the of the phase detector logic for application in the data recovery clock circuit of FIG. 3.
FIG. 4 shows several combined embodiments of the data clock recovery circuit in a demultiplexer configuration having a bit error rate detector logic.

FIG. 4 shows combined embodiments of the data clock recovery circuit 3 in a demultiplexer configuration having a bit error rate detector logic 8. SW2 of FIG. 2 is replaced here by a D latch device 9, whose function is to synchronize the transitions of output signal b0 to the falling edge of CKQ. The D latch has a clock input ck coupled to the quadrature clock oscillator signal CKQ, and a data input D coupled to the respective output Q of the sampling device 5-1. By doing this both parallel outputs b0 and b1 have simultaneously occurring transitions. This architecture enables assessment of the data signal quality by enabling an estimation of the bit-error-rate (BER). Thereto the circuit 3 may further comprises a controllable switch SW3 having a switch control input CKQ coupled to the quadrature clock oscillator 6, two data inputs coupled to the respective outputs Q and Q of the sampling devices 5-3 and 5-4 respectively, and a switch output Vc coupled to the BER detector logic 8. Further BER detector inputs are formed by Va and Vb.

The functioning of the BER detector logic 8 is as follows. The value of the Va, Vb and Vc samples is compared, in case the condition Va equals Vb is fulfilled. As this means that no transition has taken place during the previous interval the Vc signals is expected to have the same value as Va and Vb. If this is not the case then the explanation is that a wrong decision has been taken by one or several of the sampling devices 5. This can only be explained by the presence of additive noise on the input data signal, leading to the conclusion that a degradation in the quality of the transmission channel has occurred, resulting in a BER related loss of signal.

Figure 5A:
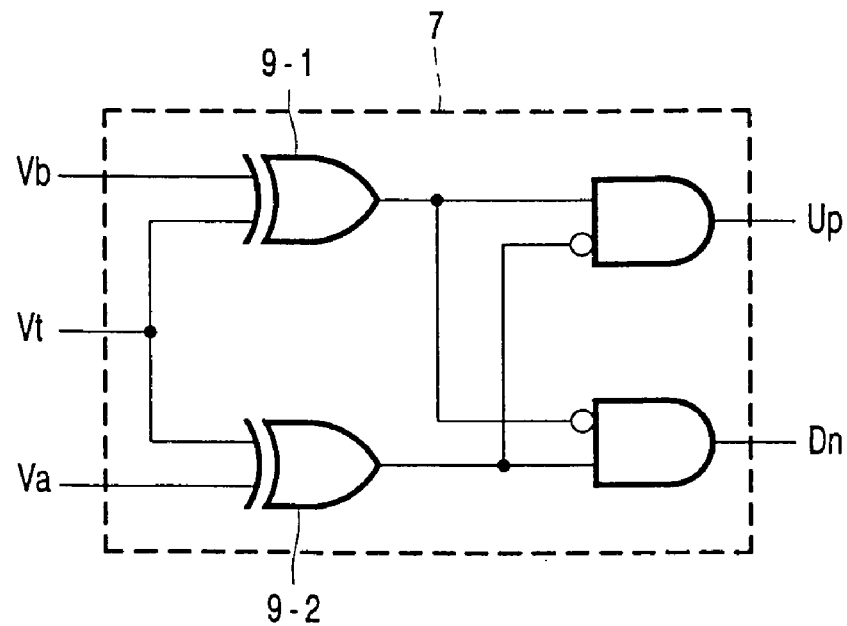
FIGS. 5a and 5b show embodiments of phase detector logic and bit error rate logic respectively for application in the recovery circuits of FIGS. 2 and 4.
Figure 5B:
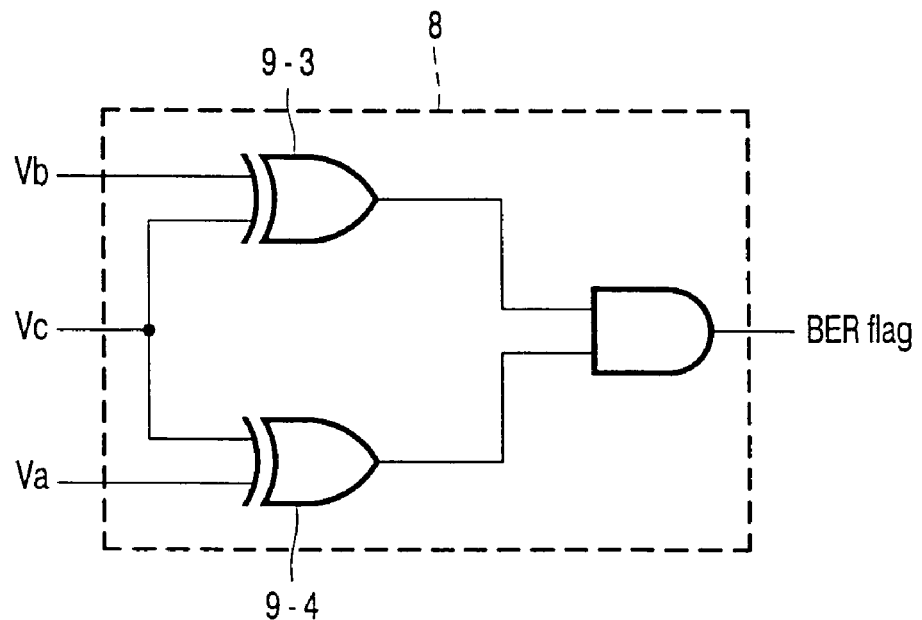

FIGS. 5*a* and 5*b* show embodiments of phase detector logic and bit error rate logic respectively for application in the recovery circuits of FIGS. 2 and 4. The very simple logic implementations exemplified here each comprise two exclusive OR circuits 9-1 to 9-4 whereto signals as indicated are fed. Logics 7 and 8 further comprise AND gates 10-1 to 10-3 for providing the UP/Dn signals and a BER flag for tuning the frequency of the quadrature oscillator 6 and for indicating an observed bit error respectively.

Whilst the above has been described with reference to essentially preferred embodiments and best possible modes it will be understood that these embodiments are by no means to be construed as limiting examples of the devices concerned, because various modifications, features and combination of features falling within the scope of the appended claims are now within reach of the skilled person.

What is claimed is:

1. A data clock recovery circuit comprising a controllable quadrature clock oscillator operating at half the data rate of data input to said circuit, and a phase detector logic having detector inputs coupled to the data input and having a detector output coupled to a frequency control input of the quadrature clock oscillator, characterized in that the data clock recovery circuit further comprises a parallel arrangement of sampling devices each having a clock input which is coupled to the controllable quadrature clock oscillator, a data input for the data input to said circuit, said clock inputs being connected directly together and said data inputs being connected directly together, and a data output coupled to the phase detector, and further characterized in that the data outputs of the respective sampling devices are coupled to controllable switches each having a switch control input coupled to the quadrature clock oscillator, two data inputs coupled to a respective pair of said data outputs, and switch outputs for providing either serial output data or control signal output.

2. The data clock recovery circuit of claim 1, characterized in that the sampling devices form a parallel arrangement of flip-flops.

3. The data clock recovery circuit of claim 2, characterized in that the flip-flops are provided with clock inputs which are responsive to either the raising, or falling edges of respective I and Q oscillator signals of the quadrature clock oscillator.

4. The data clock recovery circuit according to claim 1, characterized in that one of the controllable switches is replaced by a latch device, the latch device having a clock input coupled to the quadrature clock oscillator, and a data input coupled to one data output of the the data outputs.

5. The data clock recovery circuit according to claim 1, characterized in that said circuit comprises (bit error rate) BER detector logic, and one of the pairs o the data outputs is are coupled to a further controllable switch having a switch control input coupled to the quadrature clock oscillator, two data inputs coupled to the one pair of data outputs, and a switch output coupled to the BER detector logic.

6. The data clock recovery circuit according to claim 5, characterized in that the phase detector logic and the bit error rate detector logic comprise elementary digital logic circuits, including exclusive OR gates, inverters or logic gates, including AND, NAND, OR, or NOR gates.

7. A data receiver provided with a data clock recovery circuit according to claim 1.

8. A communication device comprising a data receiver according to claim 7.

* * * * *